United States Patent
Lin et al.

(10) Patent No.: US 8,091,876 B2
(45) Date of Patent: Jan. 10, 2012

(54) FIXTURE FOR SECURING OPTOELECTRONIC PACKAGES FOR WIRE AND/OR COMPONENT BONDING

(75) Inventors: Kai-Sheng Lin, Sugar Land, TX (US); Chian-Hung Chen, Sugar Land, TX (US); Limin Chen, Houston, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 852 days.

(21) Appl. No.: 12/171,049

(22) Filed: Jul. 10, 2008

(65) Prior Publication Data
US 2010/0008093 A1 Jan. 14, 2010

(51) Int. Cl.
*B25B 3/00* (2006.01)
(52) U.S. Cl. .............................. 269/903; 29/270; 29/747
(58) Field of Classification Search .................. 269/903; 29/270, 747
See application file for complete search history.

(56) References Cited

U.S. PATENT DOCUMENTS

| | | | | |
|---|---|---|---|---|
| 4,934,677 A | * | 6/1990 | Mitlin et al. | 269/254 CS |
| 7,757,740 B2 | * | 7/2010 | Nakamura | 156/542 |

* cited by examiner

*Primary Examiner* — Lee D Wilson
*Assistant Examiner* — Shantese McDonald
(74) *Attorney, Agent, or Firm* — Grossman Tucker Perreault & Pfleger, PLLC; Norman S. Kinsella

(57) ABSTRACT

Generally, a fixture for securing optoelectronic packages may be used to secure one or more optoelectronic packages for mounting one or more components and/or one or more wires to at least first and second mounting surfaces at different relative angles. The fixture is rotatable between at least first and second mounting positions with a top surface of the fixture being at respective first and second mounting angles relative to a horizontal plane. The fixture may be configured to secure the optoelectronic package(s) for positioning at different mounting angles to facilitate mounting the components and/or wires to the mounting surfaces at the different angles. The fixture may also be configured to be continuously adjustable over a range of angles between the first and second mounting angles.

19 Claims, 7 Drawing Sheets

FIXTURE FOR SECURING OPTOELECTRONIC PACKAGES FOR WIRE AND/OR COMPONENT BONDING

TECHNICAL FIELD

The present disclosure relates to optoelectronic packaging and in particular, to a fixture for securing an optoelectronic package for wire and/or component bonding.

BACKGROUND INFORMATION

The following descriptions and examples are not admitted to be prior art by virtue of their inclusion within this section.

Certain optoelectronic packages include components that are mounted at an angle (i.e., a mounting angle) relative to other components or mounting surfaces in the optoelectronic package. One such angled component is a photodetector. The term photodetector generally refers to any type of radiation detector that detects electromagnetic radiation. A photodetector may be used in a laser package (e.g., in an optical transmitter) to monitor light being emitted from a laser and coupled into an optical fiber. A photodetector may also be used in a photodetector package (e.g., in an optical receiver) to receive and detect light exiting an optical fiber.

In a laser package, for example, the photodetector is commonly provided in the same package as the laser to function as a check device to verify the proper operation of the laser. This photodetector is sometimes referred to as a "monitor photodetector" or "monitor photodiode," due to its function in monitoring the output power of the laser. In such laser packages, a fiber may be mounted to receive the primary laser light output from a laser diode and a photodiode may be mounted to receive the small portion of light emitted from the back of the laser diode. This photodiode may be mounted at an intermediate angle between 0° and 90° relative to the emitted light because an angle of 0° may detect too little light and an angle of 90° may cause excessive back reflection. Likewise, a photodiode may be mounted at an angle within a photodetector package in a receiver so that the light output from the output end of the fiber is directed onto the active or light-receiving region of the surface of the photodiode.

One example of an optoelectronic package is a TO (transistor outline) can type package, which may be used to align and position the photodetector, laser, fiber, and/or related optical components. Other optical components may include collimation and coupling lenses, isolators, and the like to optically couple the laser or photodiode to the fiber. These components may be mounted in the TO can package (e.g., to the TO can post and/or header), and an optical fiber may be aligned with the components and coupled to the package (e.g., sometimes referred to as fiber pigtailing). As mentioned above, some of these components (e.g., the photodetector) may be mounted at a mounting angle (e.g., between 0° and 90° in the TO can package), other components may not be angled (i.e., a mounting angle of 0°) and yet other components may be mounted at a 90° angle.

The optical components may be electrically interconnected by wires and/or conductive traces. A wire may also connect an optical component to a substrate and/or an electrical contact that is connected to a conductive pin. A wire may be attached to an optical component, conductive trace, substrate and/or electrical contact using a wire bonding process. Wire bonding processes include thermocompression, ultrasonic and/or thermosonic processes. In the thermocompression process, bonding occurs at relatively high pressure and temperature (e.g., about 300° C. to about 500° C.). Ultrasonic and thermosonic processes use ultrasonic energy to form the bonds. In the thermosonic process, bonding occurs at a relatively moderate temperature (e.g., about 100° C. to about 240° C.).

To mount the components (e.g., laser diodes, photodiodes, lenses, and the like) in the proper locations with the desired mounting angles and to bond the wires, the optoelectronic package may be first secured in a fixture. A pick and place machine may then precisely position the components in the appropriate mounting location within the package for bonding to the mounting surface. Mounting components at an angle using these machines presents unique challenges because the pick and place machines generally position components straight into the package (i.e., not at an intermediate mounting angle).

Bonding the wires in the proper locations and to components that have been mounted at angles may also present unique challenges because wire bonding machines are generally configured to bond wires to surfaces that are generally horizontal with respect to the wire bonding machine. Further, for wire bonding processes that include ultrasonic energy, the surfaces to be bonded must be held firmly to ensure proper coupling of ultrasonic energy. Fixtures exist for wire bonding but are limited in that, in some cases, only one optical package may be accommodated at a time, the fixture may be positioned only at 0° or 90° relative to a horizontal plane and/or the fixture may not withstand and/or be capable of being heated.

BRIEF DESCRIPTION OF THE DRAWINGS

These and other features and advantages will be better understood by reading the following detailed description, taken together with the drawings wherein.

DETAILED DESCRIPTION

Generally, a fixture for securing optoelectronic packages, consistent with the present disclosure, may be used to secure one or more optoelectronic packages for mounting one or more components and/or one or more wires to at least first and second mounting surfaces at different relative angles. The fixture is rotatable between at least first and second mounting positions with a top surface of the fixture being at respective first and second mounting angles relative to a horizontal plane. As described in greater detail below, the fixture may be configured to secure the optoelectronic package(s) for positioning at different mounting angles to facilitate mounting the components and/or wires to the mounting surfaces at the different angles. The fixture may also be configured to be continuously adjustable over a range of angles between the first and second mounting angles. The fixture may also be configured for heating for use in bonding processes that include elevated temperatures. The fixture may be portable and/or may be integrated into a bonding machine.

According to exemplary embodiments described herein, fixtures may be configured to secure a TO can type package while one or more components and/or wires are mounted to the TO can type package. The TO can type package may be a TO can laser package or a TO can photodetector package. The system and method described herein may also be configured to secure other types of optoelectronic packages.

Figure 1A:
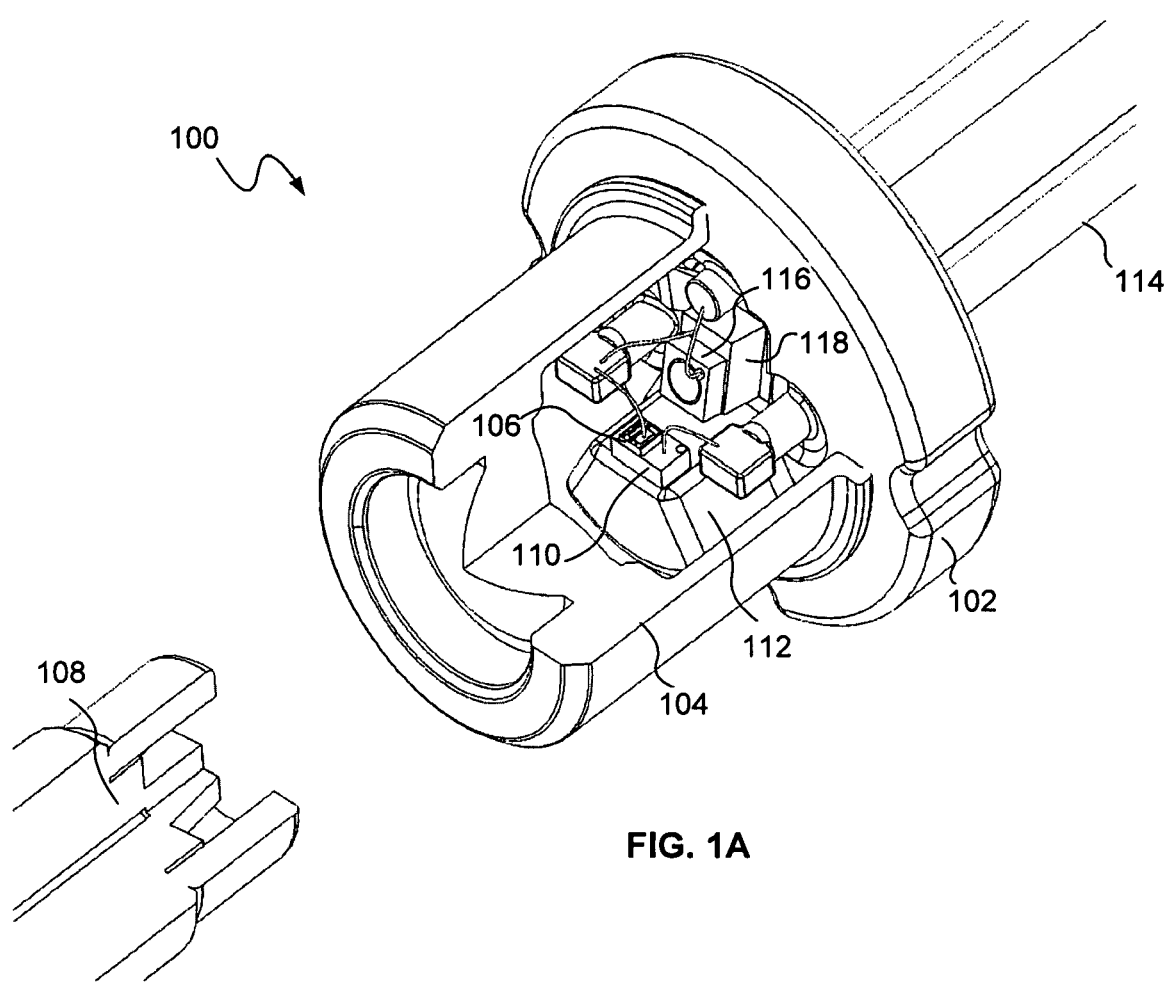
FIGS. 1A and 1B are perspective views of optoelectronic packages that may be used with a fixture for securing optoelectronic packages, consistent with the present disclosure.

FIG. 1A shows a cut-away view of an illustrative TO can laser package 100 that may be secured using the fixture described herein. The depicted TO can package 100 includes a TO can header 102 and TO can housing 104. A portion of the TO can housing 104 is shown cut away for illustrative purposes. The TO can housing 104 may be assembled after components and/or wires have been mounted and/or bonded in the laser package 100. TO can housing 104 may be configured to optically couple a semiconductor laser 106 to an optical fiber 108. Laser 106 may be located in a variety of different arrangements, such as on a submount 110 disposed within the TO can housing 104.

The TO can housing 104 may align and position laser 106, optical fiber 108 and related optical components to each other so that the laser 106 may be optically coupled to the fiber 108. In some embodiments, the TO can housing 104 may be coupled to a TO can header 102 having a TO can post 112. Laser 106 may be mounted on laser submount 110 located on TO can post 112 of TO can header 102. TO can package 100 may also include one or more conductive pins 114, which may extend through TO can header 102. TO can package 100 may further include a photodetector 116, which may be coupled to a photodetector submount 118. The photodetector 116 (and the optional submount 118) may be positioned at an angle between 0° and 90° relative to the header 102 and the post 112 such that the photodetector 116 detects a sufficient amount of light while minimizing excessive back reflection. Of course, other configurations and arrangements are also possible. A similar TO can type laser package may also be used for a photodetector package (i.e., without a laser).

Figure 1B:
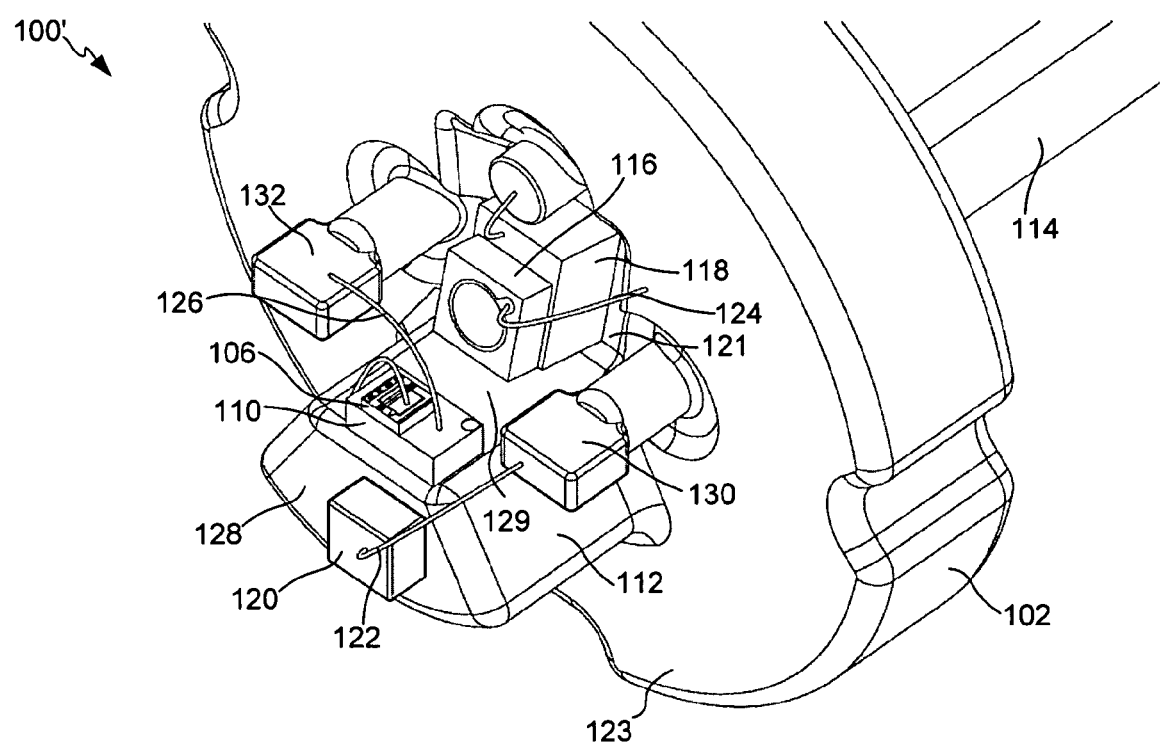

FIG. 1B shows another example of a TO can laser package 100' that may be secured using the fixture described herein. For FIGS. 1A and 1B, like elements have like reference designators. This example does not include the TO can housing 104 that was shown in cut-away view in FIG. 1A. In this embodiment, the TO can laser package 100' further includes a component 120 mounted on a mounting surface 128 of the TO can post 112. The mounting surface 128 is at an angle (e.g., 90°) relative to a mounting surface 129 on which the laser 106 is mounted on the laser submount 110. The photodetector 116 and submount 118 may also be mounted on a mounting surface 121, which is at an angle (e.g., 12°) relative to the mounting surface 128 or the surface 123 of the TO can post 102. The TO can package 100' further includes interconnecting wires 122, 124, 126. For example, wire 122 may connect the component 120 to a first electrical contact 130, wire 124 may connect the photodetector 116 to a substrate and wire 126 may connect the laser submount 110 to a second electrical contact 132.

Figure 2A:
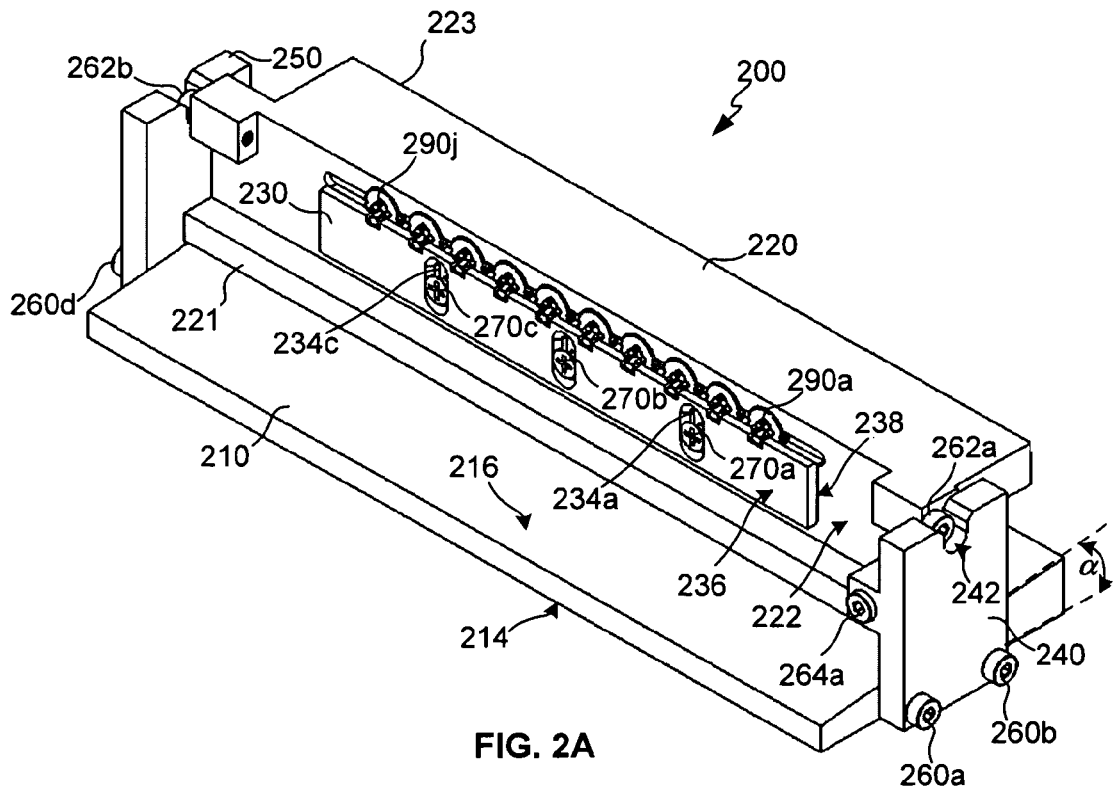
FIGS. 2A and 2B are perspective views of an embodiment of an optoelectronic package fixture, positioned at a first mounting angle, consistent with the present disclosure.
Figure 2B:
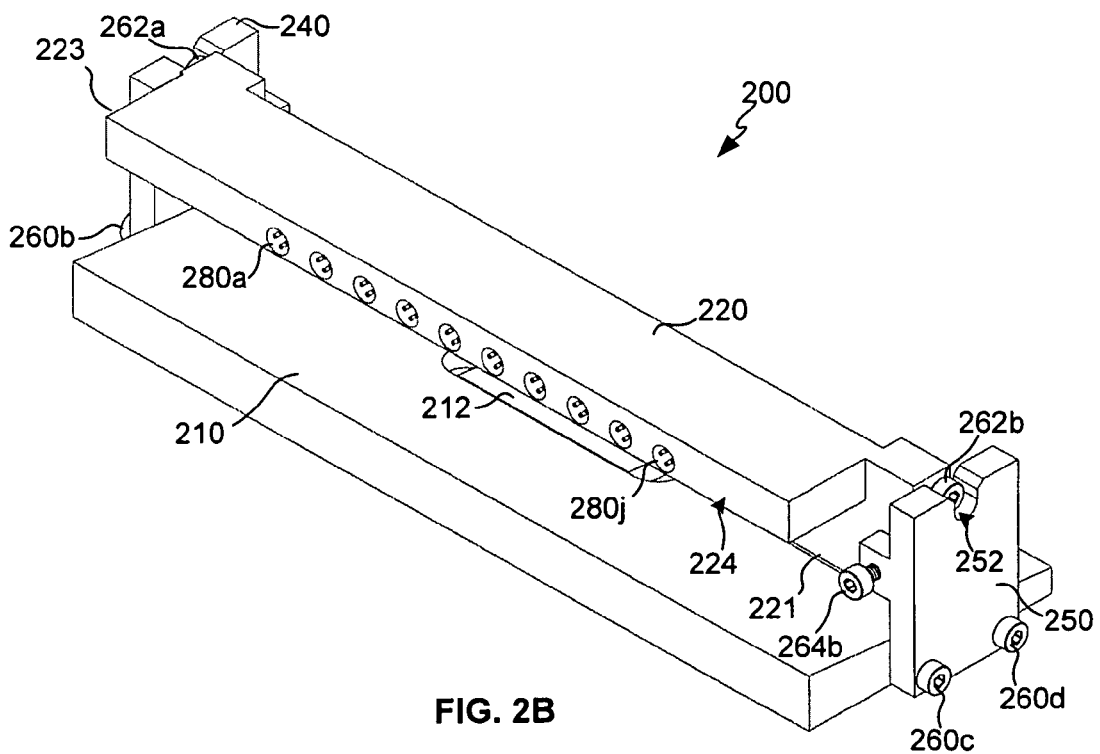
Figure 3A:
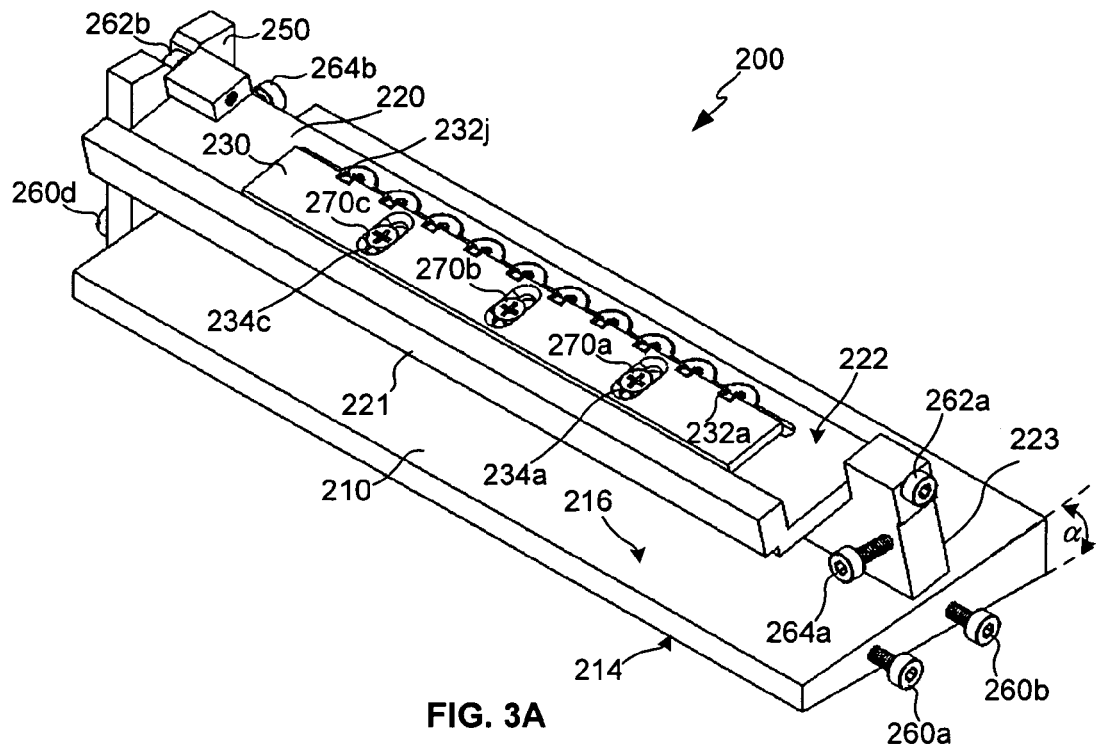
FIGS. 3A and 3B are perspective views of an embodiment of an optoelectronic package fixture, positioned at a second mounting angle, consistent with the present disclosure.
Figure 3B:
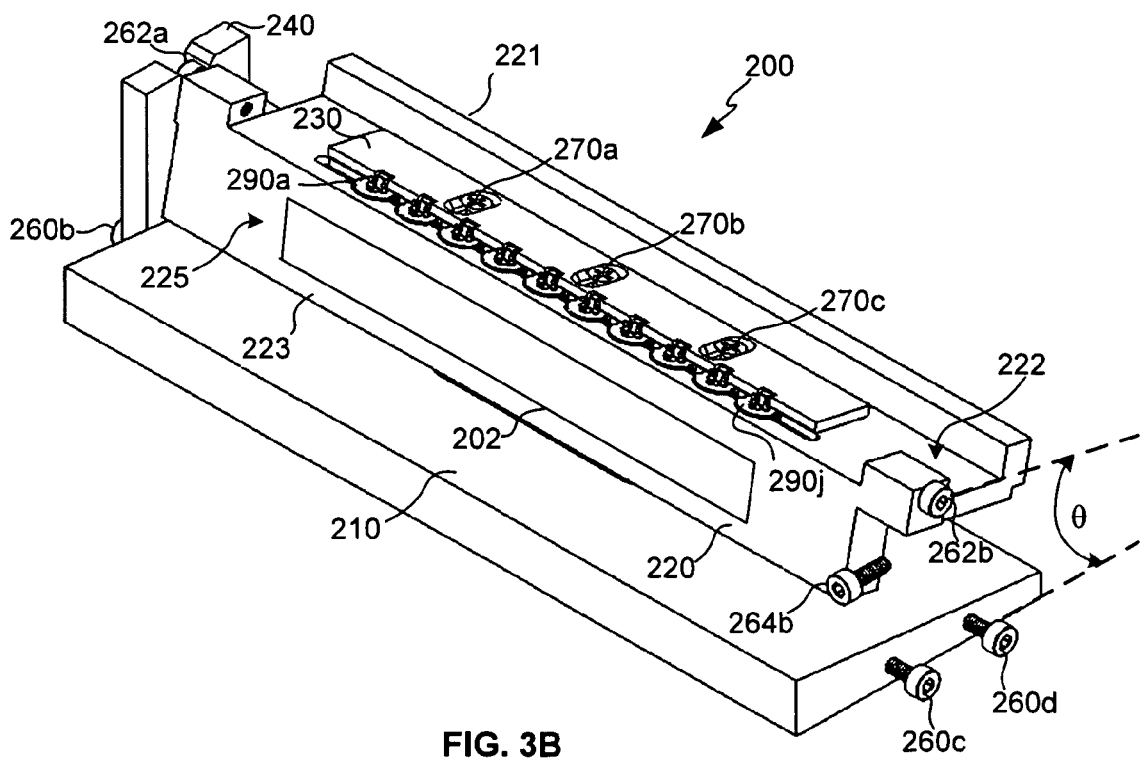

FIGS. 2A, 2B, 3A and 3B illustrate an embodiment of an optoelectronic package fixture 200 in first and second mounting positions, respectively. For FIGS. 2A, 2B, 3A, 3B and 4 through 8, like elements have like reference designators. FIGS. 2A and 2B show the optoelectronic package fixture 200 in a first mounting position relative to a horizontal plane (e.g., at a mounting angle of about 90°). FIGS. 3A and 3B show optoelectronic package fixture 200 in a second mounting position relative to a horizontal plane (e.g., at a mounting angle of about 12°). As used herein, "about" means within acceptable tolerances known to those skilled in the art. The optoelectronic package fixture 200 may also be positioned in other angular mounting positions between the first and second mounting positions.

The optoelectronic package fixture 200 may be configured to receive and hold one or more optoelectronic packages 290a-290j, such as TO can packages 100, 100' shown in FIGS. 1A and 1B. In one example, the fixture 200 may secure the TO can package 100' for bonding one or more components and/or wires while in one of the mounting positions.

The fixture 200 generally includes a base 210, a holder 220, and a locker 230. The holder 220 holds the optoelectronic packages 290a-290j and is rotatably coupled to the base 210 between at least the first and second mounting positions. The locker 230 is coupled to the holder 220 for locking or securing the optoelectronic packages 290a-290j in the holder 220.

Figure 4:
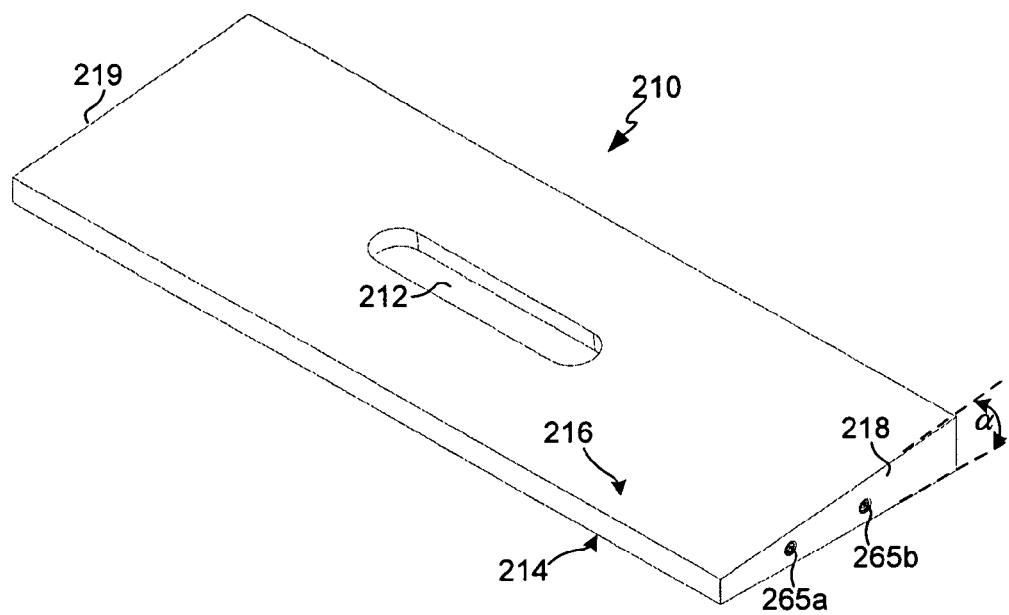
FIG. 4 is a perspective view of an embodiment of a base of an optoelectronic package fixture, consistent with the present disclosure.
Figure 5:
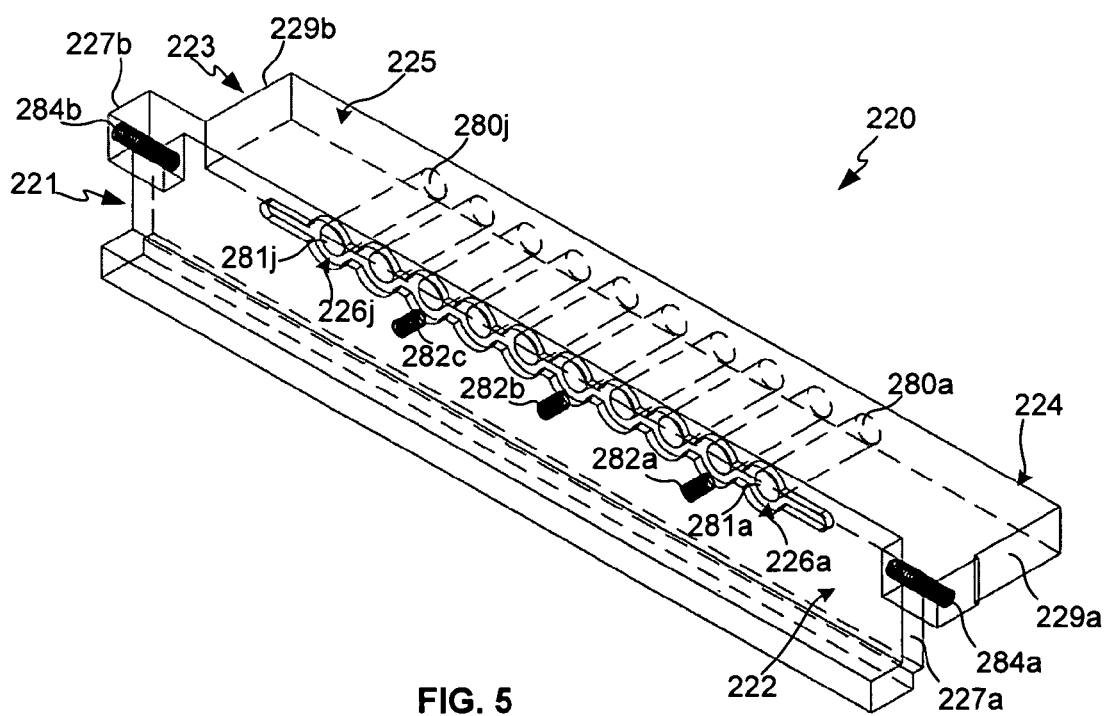
FIG. 5 is a perspective view of an embodiment of a holder of an optoelectronic package fixture, consistent with the present disclosure.
Figure 6:
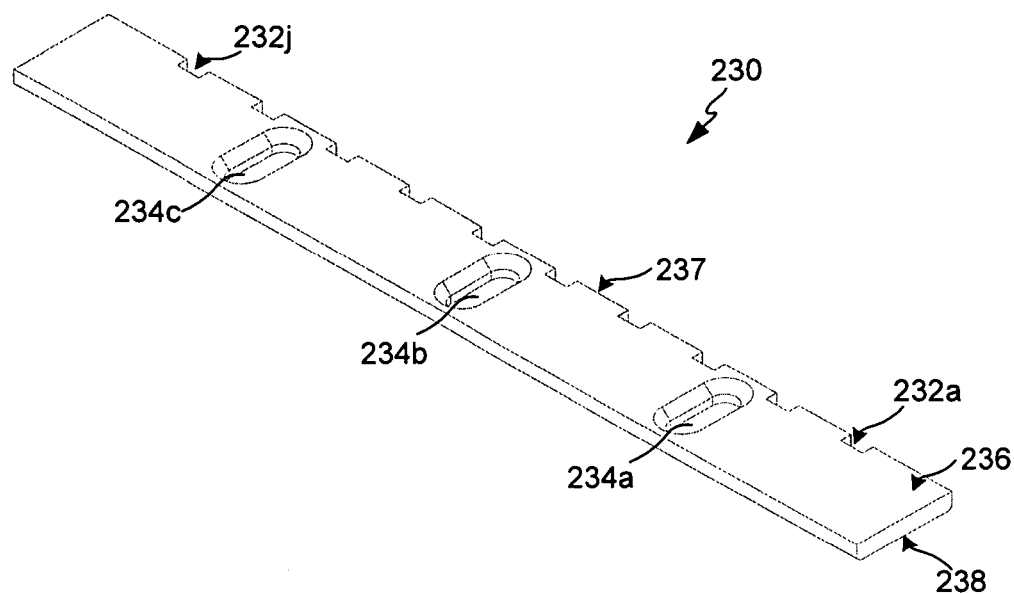
FIG. 6 is a perspective view of an embodiment of a locker of an optoelectronic package fixture, consistent with the present disclosure.

FIGS. 4, 5 and 6 show embodiments of the base 210, the holder 220 and the locker 230, respectively, in greater detail. Turning now to FIG. 4, the base has a bottom surface 214, a generally opposing top surface 216, a first end 218 and an opposing second end 219. The base 210 may be configured such that when the fixture 200 is in position in a bonding machine, for example, the bottom surface 214 is substantially parallel to a horizontal plane. The top surface 216 may be at an angle, α, relative to the bottom surface 214. The angle α may facilitate positioning the holder 220 at the first and second mounting angles relative to the horizontal plane. In one embodiment, the angle α of the tope surface 216 of the base 210 allows the holder 220 to be positioned between a first mounting angle of 90° and a second mounting angle of 2α relative to the base bottom surface 214 and/or the horizontal plane. To provide a second mounting angle of 12°, for example, the angle α of the top surface 216 of the base 210 may be about 6°.

The base 210 may also include a magnetic region that provides a magnetic force to pull the holder 220 into the first and/or second mounting positions. In one embodiment, the base 210 may define a slot 212 that extends from the top surface 216 at least partially into the base 210. In an embodiment, the slot 212 may be configured to receive a magnet (not shown) to provide the magnetic force. The magnetic region may also be formed on the base 210 in other ways such as, for example, by magnetizing the material of the base 210.

The base 210 may be constructed of any suitable material known to those skilled in the art. The material may be rigid and may maintain its rigidity at elevated temperatures such as may be used in some bonding processes, e.g., thermosonic bonding. In an embodiment, the base 210 may be constructed of a metal, for example aluminum.

Turning now to FIG. 5, the holder 220 has a top portion 221 and a side portion 223 extending at an angle relative to the top portion 221. The top portion 221 has a first end 227a, an opposing second end 227b and a top surface 222. The side portion 223 has a first end 229a, an opposing second end 229b, a bottom surface 224 and an outer side surface 225. The top surface 222 and the bottom surface 224 may be opposing and may be substantially parallel. The top portion 221 may be at about a 90° angle relative to the side portion 223. The respective first ends 227a, 229a of the top portion 221 and side portion 223 may be offset (i.e., may not be aligned) to accommodate mounting angle adjustment as will be discussed in more detail below. The respective second ends 227b, 229b of the top portion 221 and the side portion 223 may be similarly offset to accommodate mounting angle adjustment as will be discussed in more detail below.

In an embodiment, the outer side surface 225 may be configured to receive a heating element 202. The heating element 202 may be used to heat the fixture 200 for bonding processes (e.g., thermosonic) that include elevated temperature. The holder 220 may be constructed of a suitable thermally conductive material known to those skilled in the art. In an embodiment, the holder 220 may be constructed of a ferromagnetic material such as a magnetic steel. For example, the holder 220 may be constructed of carbon steel.

The holder 220 may define a plurality of passageways, e.g., passageways 280a-280j. The passageways 280a-280j each have an end 281a-281j at or near the top surface 222. The passageways 280a-280j may extend in the side portion 223, from the top surface 222 toward the bottom surface 224 and may be substantially perpendicular to the top surface 222. Although the passageways 280a-280j are shown as extending through the side portion 230, one or more of the passageways 280a-280j also may extend only partially into the side portion 230. The holder 220 may further define a recess in the top surface 222 and about the end of each passageway 281a-281j, e.g., package supporting surfaces 226a-226j. The package supporting surfaces 226a-226j may be separated by portions of the top surface 222 or may be interconnected. Each passageway 280a-280j and respective package supporting surface 226a-226j may be configured to receive and hold an optoelectronic package 290a-290j. Each optoelectronic package 290a-290j may be oriented so that conductive pins are received in a respective passageway 280a-280j.

In an embodiment, the holder 220 may be configured to receive and hold TO can packages such as TO can package 100'. Each TO can package 100' may be positioned in the holder 220 so that the TO can header 102 contacts a package supporting surface 226a-226j. In other embodiments, the holder 220 may be configured to receive and hold other types of optoelectronic packages.

The holder 220 may be rotatably coupled to the base 210 using shafts 262a, 262b that rotatably engage couplings 240, 250. In one embodiment, the holder 220 may define one or more shaft holes 284a and 284b configured to receive respective shafts 262a, 262b. The shaft holes 284a, 284b may be positioned at opposing ends of the holder 220 at or near an intersection of the top portion 221 and side portion 223. The shaft holes 284a and 284b may be coaxial. In an embodiment, a shaft 262a, 262b may be a threaded member such as a machine screw. The shafts 262a, 262b may also be coupled to the holder 220 in other ways, for example, formed as one piece with the holder 220.

Referring now to FIG. 6, one embodiment of the locker 230 that may be used to secure the optoelectronic packages in the holder 220 is described in greater detail. The locker 230 has a top surface 236 and a bottom surface 238. The locker 230 may define one or more slots, e.g., slots 234a-234c that may be configured to receive one or more removable fixing members 270a-270c. The holder 220 may further define one or more holes 282a-282c, each configured to receive a removable fixing member, such as fixing members 270a-270c. In an embodiment, a fixing member 270a-270c may be a threaded member such as a screw. In an embodiment, each slot 234a-234c may include a taper configured to accommodate a head of a removable fixing member. Each slot 234a-234c in the locker 230 may be configured to be substantially aligned with each of the one or more holes 282a-282c in the holder 220. When the locker 230 is coupled to the holder 220, each fixing member 270a-270c may be positioned extending from the top surface 236 of the locker 230, through each slot 234a-234c and into the holder 220. Each slot 234a-234c may be elongated in a direction parallel to the top surface 236 and perpendicular to an edge 237, allowing the locker 230 to be slidably coupled to the holder 220.

The locker 230 may also define a plurality of edge slots 232a-232j along its edge 237, each configured to receive and fix each optoelectronic package 290a-290j in a position in each passageway 280a-280j. In an embodiment, the edge slots, 232a-232j, may be configured to receive a TO can post, e.g., TO can post 112, with the TO can header being secured by the locker 230.

The locker 230 may be constructed of any suitable material known to those skilled in the art. The material may be rigid and may maintain its rigidity at elevated temperatures such as may be used in some bonding processes, e.g., thermosonic bonding. In an embodiment, the locker 230 may be constructed of a metal. For example, the locker 230 may be constructed of a stainless steel such as SUS 304.

Other lockers or locking mechanisms may also be used to secure the optoelectronic packages 290a-290j within the passageways 280a-280j. For example, the locker may include clamps or magnetic regions that magnetically secure the optoelectronic packages.

Figure 7:
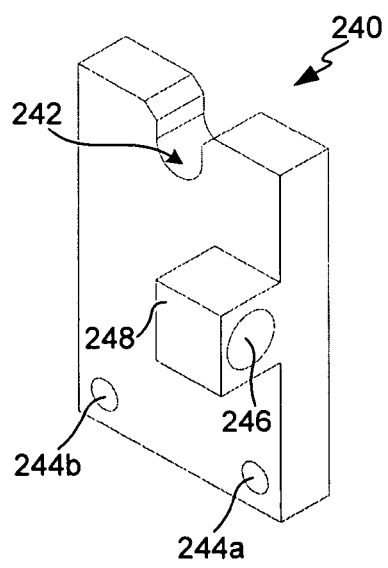
FIG. 7 is a perspective view of an embodiment of a first coupling of an optoelectronic package fixture, consistent with the present disclosure.
Figure 8:
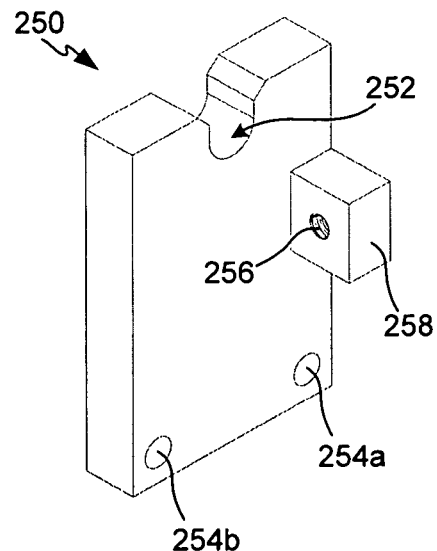
FIG. 8 is a perspective view of an embodiment of a second coupling of an optoelectronic package fixture, consistent with the present disclosure.

Referring now to FIGS. 7 and 8, the first coupling 240 and second coupling 250 used to rotatably couple the holder 220 to the base 210 are described in greater detail. In an embodiment, the first coupling 240 and second coupling 250 may each define one or more mounting holes, e.g., 244a, 244b and 254a, 254b. The mounting holes 244a, 244b, 254a, 254b may each be configured to receive a fixing member, e.g., fixing members 260a, 260b, 260c, 260d, respectively. The base 210 may also define one or more mounting holes 265a, 265b in its first end 218 configured to receive the fixing members 260a, 260b. The base 210 may similarly define one or more mounting holes (not shown) in its second end 219 configured to receive fixing members 260c 260d. In an embodiment, the fixing members 260a-260d may be threaded members such as machine screws. The coupling members 240, 250 may also be coupled to the base 210 in other ways, for example, formed as one piece.

The first coupling 240 and the second coupling 250 may each define a support surface 242, 252 configured to receive the first shaft 262a and the second shaft 262b, respectively. Each support surface 242, 252, may define an arc, substantially perpendicular to an axis of each shaft 262a, 262b. In an embodiment, the first shaft 262a and the second shaft 262b may each be rotatably and slidably coupled to the respective support surface 242, 252.

The fixture 200 may also include an angle adjustment mechanism that adjusts a mounting position of the holder 220 to one or more mounting angles between the first and second mounting angle. The angle adjustment mechanism may include one or more adjustment members that engage one or both of the top portion 221 and the side portion 223 of the holder 220. In one embodiment, the fixture 200 may include a first angle adjustment member 264a to engage the side portion 223 and a second angle adjustment member 264b to engage the top portion 221. The first coupling 240 and the second coupling 250 may each include a respective receptacle portion 248, 258. The receptacle portion 248 of the first coupling 240 may define a first hole 246 configured to receive the first angle adjustment member 264a. The receptacle portion 258 of the second coupling 250 may define a second hole 256 configured to receive the second angle adjustment member 264b. The receptacle portion 248 of the first coupling 240 may be sized so as to not interfere the first end 227a of the top portion 221 of the holder 220. The receptacle portion 258 of the second coupling 250 may be sized so as to not interfere with the second end 229b of the side portion 223 of the holder 220.

In an embodiment, the first and second angle adjustment members 264a, 264b may be configured to adjust and/or hold the top surface 222 of the holder 220 at a mounting angle relative to a bottom surface of the base 210 and/or relative to a horizontal plane. In an embodiment, the first and second angle members 264a, 264b may be threaded members such as screws. In this embodiment, the holes 246, 256 may each include at least one thread for receiving the respective angle members 264a, 264b.

The first coupling 240 and the second coupling 250 may be constructed of any suitable material known to those skilled in the art. The material may be rigid and may maintain its rigidity at elevated temperatures such as may be used in some bonding processes, e.g., thermosonic bonding. In an embodiment, the first coupling 240 and the second coupling 250 may be constructed of a metal, for example aluminum.

Referring again to FIGS. 3A and 3B, the fixture 200 is depicted with the holder 220 positioned at a mounting angle, θ, relative to the bottom surface 214 of the base 210 and/or a horizontal plane. As discussed above, the mounting angle may be between 0° and 90°. In the embodiment depicted in FIGS. 3A and 3B, the mounting angle is about 12°. In FIG. 3A a first coupling 240 has been removed and in FIG. 3B a second coupling 250 has been removed, both for illustrative purposes. In normal operation, both couplings 240 and 250 would be in place as shown, for example, in FIGS. 2A and 2B.

The holder 220 may be positioned at an angle relative to a horizontal plane. This angle may be chosen to facilitate insertion of an optoelectronic package 290a-290j, e.g., TO can package 100', in the fixture 200. The locker 230 may be positioned on the holder 220 so that the edge 237 does not overlap a package supporting surface 226a-226j. The removable fixing members 270a-270c may be adjusted (e.g., loosened) to allow the locker 230 to be repositioned and may be further adjusted (e.g., tightened) to hold the locker 230 in place. Each of one or more optoelectronic packages 290a-290j, may be inserted into the holder 220. Each optoelectronic package 290a-290j may be oriented for insertion such that pins 114 may be received in a passageway 280a-280j as the optoelectronic package 290a-290j is inserted in the holder 220. In an embodiment, each optoelectronic package 290a-290j may further be oriented so an alignment member, e.g., TO can post 112, may be aligned with a slot 232a-232j on the locker 230. Each optoelectronic package 290a-290j may be positioned in the holder 220 so that a bottom surface, e.g., of a TO can header 102, contacts a package supporting surface 226a-226j. The package supporting surface 226a-226j is recessed relative to the top surface 222 so that the bottom surface 238 of the locker 230 may contact the top surface 222 of the holder 220 without interference from an optoelectronic package 290a-290j.

Once a desired number of optoelectronic packages 290a-290j have been inserted in the holder 220, the locker 230 may be repositioned so that each slot 232a-232j in the locker 230 receives an alignment member, e.g., TO can post 112. The removable fixing members 270a-270c may then be adjusted to hold the locker 230 in place. In the holding position, the locker 230 may at least partially overlap each TO can header 102 thereby securing each optoelectronic package 290a-290j in place.

Figure 10A:
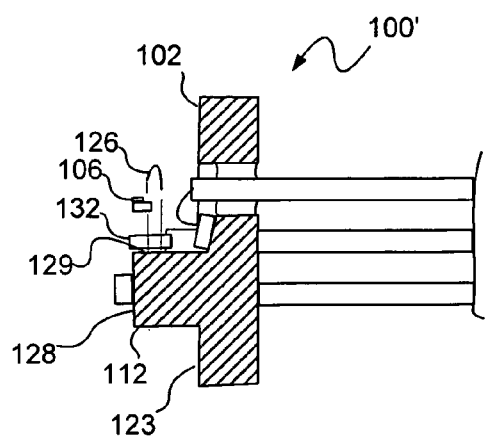
FIGS. 10A and 10B are side cross-sectional views of an optoelectronic package positioned in the respective first and second mounting positions.
Figure 10B:
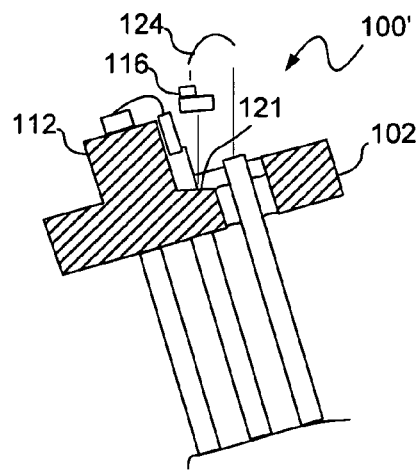
Figure 9:
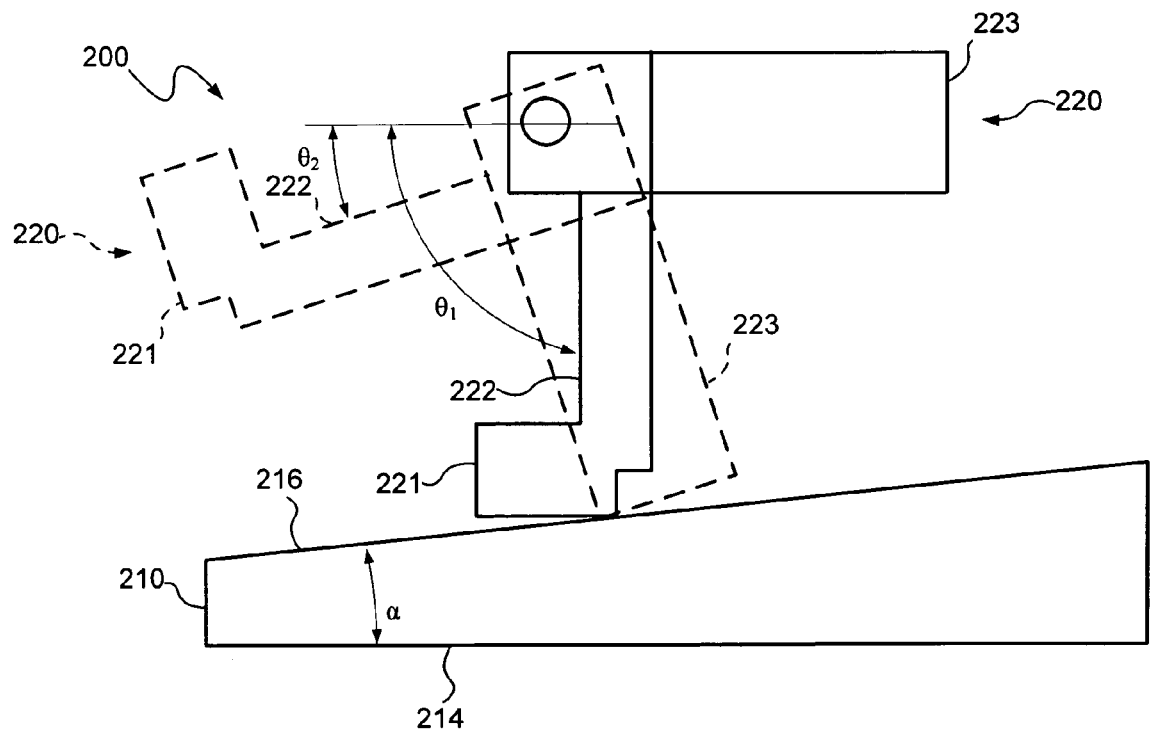
FIG. 9 is a side view of an embodiment of an optoelectronic package fixture moving between first and second mounting positions.

Referring to FIG. 9 and FIGS. 10A and 10B, an example of the positioning of the optoelectronic package fixture 200 and the optoelectronic package 100' is described in greater detail. In this exemplary embodiment, the holder 220 of the fixture 200 may be rotated between first and second mounting positions such that the top surface 222 is at respective first and second mounting angles $\theta_1$, $\theta_2$ relative to a horizontal plane and/or the bottom surface 214 of the base 210. In the first mounting position, the top portion 221 contacts the top angled surface 216 of the base 210. In the second mounting position, the side portion 223 of the holder 220 (shown in phantom) contacts the top angled surface 216 of the base 210. As mentioned above, the base 210 may include a magnetic region such that a magnetic force pulls the top portion 221 and/or the side portion 223 toward the base 210 and holds the holder 220 in the first and second mounting positions. The holder 220 may thus be quickly and accurately positioned in the first and second mounting positions.

In the exemplary embodiment, the base 210 and the holder 220 may be configured such that the first mounting angle $\theta_1$ is about 90° relative to the horizontal plane and the second mounting angle $\theta_2$ is an acute angle between 0° and 90°. In particular, the second mounting angle $\theta_2$ may be about twice the angle α of the top surface 216 of the base 210. To provide a 12° second mounting angle, for example, the angle α may be about 6°. Other angles and configurations are possible to provide different first and second mounting angles $\theta_1$, $\theta_2$. The holder 220 may also be adjusted to other mounting angles between the first and second mounting angles $\theta_1$, $\theta_2$, for example, using the angle adjustment mechanism described above.

FIGS. 10A and 10B show the optoelectronic package 100' in the respective first and second mounting positions illustrated in FIG. 9. Although the illustrated embodiment shows the holder 220 and optoelectronic package 100' positioned at the first mounting angle $\theta_1$ (e.g., 90°) and then the second mounting angle $\theta_2$ (e.g., 12°), the holder 220 and the optoelectronic package 100' may also be positioned at the second mounting angle $\theta_2$ and then the first mounting angle $\theta_1$.

As mentioned above, the optoelectronic package 100' is positioned and held in the side portion 223 of the holder 220 such that the top surface 123 of the TO can header 102 is generally parallel to the top surface 222 of the holder 220. As such, when the holder 220 is positioned in the first mounting position (FIG. 10A) at the first mounting angle $\theta_1$ of 90°, the optoelectronic package 100' is positioned with the mounting surface 129 in the horizontal plane and with the mounting surface 128 at 90° relative to the horizontal plane. Thus, components and wires (e.g., laser 106 and wire 126) may be mounted to the mounting surface 129, for example, using a machine that places the components and wires in a generally vertical direction on the mounting surface 129. When the holder 220 is position in the second mounting position (FIG. 10B) at the second mounting angle $\theta_2$ of 12°, the optoelectronic package 100' is positioned with the mounting surface 121 in the horizontal plane. Thus, components and wires (e.g., photodetector 116 and wire 124) may be mounted to the mounting surface 121, for example, using a machine that places the components and wires in a generally vertical direction on the mounting surface 121.

The fixture 200 and the optoelectronic packages 290a-290j, e.g., TO can package 100', may be incorporated into a manual or machine bonding process. For a machine bonding process, the fixture 200 may be placed in a bonding machine (not shown). The mounting angle may be further adjusted, if necessary, once the fixture 200 and optoelectronic packages 290a-290j have been placed in the bonding machine. The bonding process may include wire and/or component, including die, bonding. In an embodiment, for bonding processes that include elevated temperature, a heating element may be placed on or near the holder 220, on or near the outer side surface 225 of the side portion 223. A temperature of the holder 220 may then be adjusted using the heating element.

The mounting angle θ may be adjusted to facilitate bonding of wires and/or components at differing angles without removing the optoelectronic packages 290a-290j from the fixture 200. Once the bonding processes are complete, the optoelectronic packages 290a-290j may be removed from the fixture 200. The holder 220 may be positioned at an angle relative to a horizontal plane. This angle may be chosen to facilitate removal of an optoelectronic package 290a-290j, e.g., TO can package 100', in the fixture 200. The removable fixing members 270a-270c may be adjusted (e.g., loosened) to allow the locker 230 to be repositioned and may be further adjusted (e.g., tightened) to hold the locker 230 in place. The locker 230 may be positioned on the holder 220 so that the edge 237 does not overlap a package supporting surface 226a-226j. Each of one or more optoelectronic packages 290a-290j, may be removed from the holder 220. The holder 220 may then be ready to receive further optoelectronic packages.

Accordingly, the optoelectronic package fixture, consistent with the embodiments described herein, may facilitate the mounting of components and/or wires within complex optoelectronic packages having multiple mounting surfaces at different relative angles.

Consistent with an embodiment, a fixture is provided for securing a plurality of optoelectronic packages for mounting at least first and second wires or components on at least first and second mounting surfaces at different relative angles. The fixture includes a base including a bottom surface and a generally opposing top surface at an angle relative to the bottom surface. The fixture also includes a holder rotatably coupled to the base. The holder includes a top portion and a side portion. The top portion includes a first end, an opposing second end and a top surface. The side portion includes a first end, an opposing second end, a bottom surface and an outer side surface. The holder also defines a plurality of passageways extending from the top surface of the top portion toward the bottom surface of the side portion and configured to receive the plurality of optoelectronic packages. The holder and the base are configured such that the holder is rotatable between at least first and second mounting positions with the top surface of the top portion being at respective first and second mounting angles relative to a horizontal plane. The top portion contacts the top surface of the base in the first mounting position and the side portion contacts the top surface of the base in the second mounting position. The holder further includes a locker configured to secure the plurality of optoelectronic packages.

Consistent with another embodiment, a method is provided for bonding a wire or a component at a mounting angle in at least one optoelectronic package. The method includes: providing a fixture includes a base, a holder rotatably coupled to the base, and a locker coupled to the holder; loading at least one optoelectronic package in the holder; securing the optoelectronic package in the holder using the locker; rotating the holder to at least a first mounting position, wherein a top surface of the holder is at a first mounting angle relative to a horizontal plane; mounting at least one wire or component to a first mounting surface in the at least one optoelectronic package in the first mounting position; rotating the holder to at least a second mounting position, wherein a top surface of the holder is at a second mounting angle relative to the horizontal plane; and mounting at least one wire or component to a second mounting surface in the at least one optoelectronic package in the second mounting position.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A fixture for securing a plurality of optoelectronic packages for mounting at least first and second wires or components on at least first and second mounting surfaces at different relative angles, the fixture comprising:
a base including a bottom surface and a generally opposing top surface at an angle relative to the bottom surface;
a holder rotatably coupled to the base, the holder including a top portion and a side portion, the top portion including a first end, an opposing second end and a top surface, the side portion including a first end, an opposing second end, a bottom surface and an outer side surface, the holder defining a plurality of passageways extending from the top surface of the top portion toward the bottom surface of the side portion and configured to receive the plurality of optoelectronic packages, wherein the holder and the base are configured such that the holder is rotatable between at least first and second mounting positions with the top surface of the top portion being at respective first and second mounting angles relative to a horizontal plane, wherein the top portion contacts the top surface of the base in the first mounting position and wherein the side portion contacts the top surface of the base in the second mounting position; and
a locker configured to secure the plurality of optoelectronic packages.

2. The fixture of claim 1, wherein the first and second mounting angles include at least one mounting angle between 0° and 90° relative to the horizontal plane.

3. The fixture of claim 1, wherein the base includes a magnetic region such that a magnetic force between the base and the holder draws at least one of the top portion and the side portion toward the base.

4. The fixture of claim 1, wherein the angle of the top surface of the base relative to the bottom surface of the base is about 6°.

5. The fixture of claim 4, wherein the first mounting angle is about 90° and wherein the second mounting angle is about 12°.

6. The fixture of claim 1, further comprising an angular adjustment mechanism configured to contact at least one of the top portion and the side portion of the holder to adjust a position of the holder at other mounting angles between the first and second mounting angles.

7. The fixture of claim 1, wherein the locker is a locking plate slidably coupled to the top portion of the holder.

8. The fixture of claim 7, wherein the locking plate includes a plurality of slots along an edge, each of the plurality of slots configured to receive an alignment member of each of the plurality of optoelectronic packages.

9. The fixture of claim 1, wherein the top portion of the holder defines a recess in the top surface about an end of each passageway, the recesses being configured to receive a portion of the plurality of optoelectronic packages.

10. The fixture of claim 1, further comprising a heating element positioned adjacent the holder.

11. A method of bonding a wire or a component at a mounting angle in at least one optoelectronic package, the method comprising:
provinding a fixture includes a base, a holder rotatably coupled to the base, and a locker coupled to the holder;
loading at least one optoelectronic package in the holder;
securing the optoelectronic package in the holder using the locker;
rotating the holder to at least a first mounting position, wherein a top surface of the holder is at a first mounting angle relative to a horizontal plane;
mounting at least one wire or component to a first mounting surface in the at least one optoelectronic package in the first mounting position;
rotating the holder to at least a second mounting position, wherein a top surface of the holder is at a second mounting angle relative to the horizontal plane; and
mounting at least one wire or component to a second mounting surface in the at least one optoelectronic package in the second mounting position.

12. The method of claim 11 further comprising adjusting an angular position of the holder with respect to the horizontal plane to another mounting angle between the first mounting angle and the second mounting angle.

13. The method of claim 11, wherein the base includes an angled top surface and the holder includes a top portion and a side portion extending at an angle relative to the top portion, and wherein one of the top portion and the side portion contacts the angled top surface in the first mounting position and the other of the top portion and the side portion contacts the angled top surface in the second mounting position.

14. The method of claim 11, wherein the first and second mounting angles include at least one mounting angle between 0° and 90° relative to the horizontal plane.

15. The method of claim 11, wherein the first mounting angle is about 90° and wherein the second mounting angle is about 12°.

16. The method of claim 11 wherein the mounting includes bonding.

17. The method of claim 16, wherein the bonding includes ultrasonic bonding.

18. The method of claim 16, wherein the bonding includes thermosonic bonding or thermocompression bonding.

19. The method of claim 11, further comprising heating the optoelectronic packages to a desired temperature.

* * * * *